United States Patent
Yang et al.

(10) Patent No.: US 9,705,007 B2
(45) Date of Patent: Jul. 11, 2017

(54) THIN FILM TRANSISTOR AND FABRICATION METHOD THEREOF, AND DISPLAY DEVICE

(71) Applicant: BOE TECHNOLOGY GROUP CO., LTD., Beijing (CN)

(72) Inventors: Wei Yang, Beijing (CN); Woo Bong Lee, Beijing (CN); Ce Ning, Beijing (CN); Wenlin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 15/097,508

(22) Filed: Apr. 13, 2016

(65) Prior Publication Data

US 2016/0308061 A1    Oct. 20, 2016

(30) Foreign Application Priority Data

Apr. 16, 2015  (CN) .......................... 2015 1 0182175

(51) Int. Cl.
  *H01L 29/786* (2006.01)
  *H01L 29/24* (2006.01)
  *H01L 21/02* (2006.01)
  *H01L 29/66* (2006.01)

(52) U.S. Cl.
  CPC .... *H01L 29/7869* (2013.01); *H01L 21/02554* (2013.01); *H01L 21/02565* (2013.01); *H01L 21/02587* (2013.01); *H01L 21/02631* (2013.01); *H01L 21/02664* (2013.01); *H01L 29/24* (2013.01); *H01L 29/66969* (2013.01)

(58) Field of Classification Search
  CPC .................................................. H01L 29/7869
  See application file for complete search history.

(56) References Cited

U.S. PATENT DOCUMENTS

2012/0286264 A1* 11/2012 Suzuki ............... H01L 27/1225
                                                            257/43

* cited by examiner

*Primary Examiner* — Peniel M Gumedzoe
*Assistant Examiner* — Christopher Johnson
(74) *Attorney, Agent, or Firm* — Dilworth & Barrese, LLP; Michael J. Muselia

(57) ABSTRACT

A thin film transistor and a fabrication method thereof, and a display device are provided. The thin film transistor comprises an active layer, wherein, a target oxide is formed at a portion of the active layer where an oxygen content is higher than oxygen contents of other portions of the active layer, and a carrier mobility of the target oxide is greater than that of other portions of the active layer.

8 Claims, 3 Drawing Sheets

THIN FILM TRANSISTOR AND FABRICATION METHOD THEREOF, AND DISPLAY DEVICE

TECHNICAL FIELD

Embodiments of the present disclosure relate to a thin film transistor, a display device and a fabrication method of the thin film transistor.

BACKGROUND

Currently, in the case that an active layer of a thin film transistor is formed, a sputtering method may be used. Typically, a sputtering device for implementing the sputtering method is provided with a plurality of targets.

SUMMARY

According to embodiments of the disclosure, a thin film transistor is provided. The thin film transistor comprises an active layer. A target oxide is formed at a portion of the active layer where an oxygen content is higher than oxygen contents of other portions of the active layer, and a carrier mobility of the target oxide is greater than that of other portions of the active layer.

For example, the active layer is made of an indium gallium zinc oxide.

For example, the target oxide is formed of a zinc-based oxynitride.

For example, the active layer is formed by using a sputtering device having a plurality of targets, and the target oxide is formed at a portion of the active layer between adjacent targets of the plurality of targets.

For example, a modified layer is formed at a portion of the active layer corresponding to each target of the plurality of targets, and a carrier mobility of the modified layer is lower than that of other portions of the active layer.

For example, in a same plasma treatment process, the target oxide and the modified layer are formed.

For example, a modified layer is formed at a portion of the active layer where an oxygen content is lower than oxygen contents of other portions of the active layer, and the carrier mobility of the modified layer is lower than that of other portions of the active layer.

According to the embodiments of the disclosure, a display device is provided. The display device comprises the thin film transistor as described above.

According to the embodiments of the disclosure, a fabrication method of a thin film transistor is provided. The method comprises: forming an active layer; forming a target oxide at a portion of the active layer where an oxygen content is higher than oxygen contents of other portions of the active layer, wherein a carrier mobility of the target oxide is greater than that of other portions of the active layer.

For example, the method comprises: performing a plasma treatment on the active layer to form the target oxide.

For example, the active layer is made of an indium gallium zinc oxide.

For example, a plasma treatment is performed with using N2 on the active layer to form a zinc-based oxynitride.

For example, the forming the active layer includes: forming the active layer by a sputtering device having a plurality of targets; and the forming the target oxide includes: performing a plasma treatment with using N2 on a portion of the active layer between adjacent targets of the plurality of targets.

For example, the method further comprises: performing a plasma treatment with using N2O and/or O2 on a portion of the active layer corresponding to each target of the plurality of targets to form a modified layer, and a carrier mobility of the modified layer is lower than that of other portions of the active layer.

For example, in a same plasma treatment process, the plasma treatment is performed with using N2 on the portion of the active layer between adjacent targets of the plurality of targets and the plasma treatment is performed with using N2O and/or O2 on the portion of the active layer corresponding to each target of the plurality of targets.

For example, the method further comprises: forming a modified layer at a portion of the active layer where an oxygen content is lower than oxygen contents of other portions of the active layer, wherein the carrier mobility of the modified layer is lower than that of other portions of the active layer.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
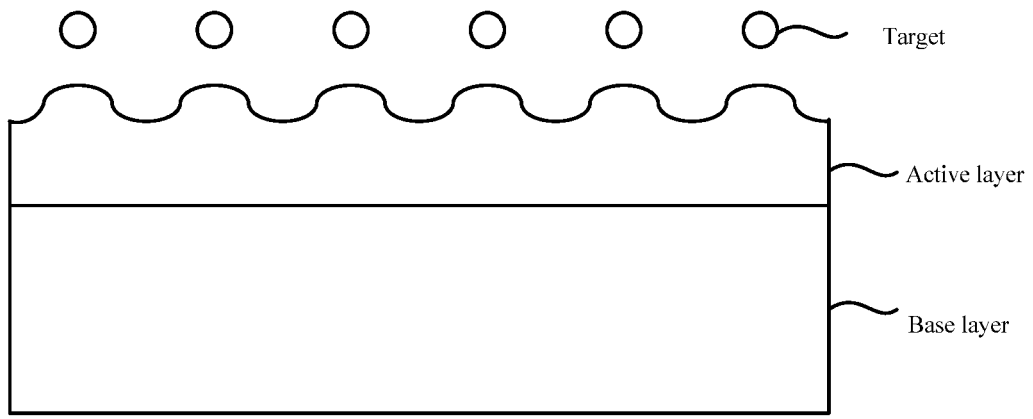
FIG. 1 shows a schematic view of forming an active layer by using a sputtering method according to one technique.

FIG. 1 shows a schematic view of forming an active layer by using a sputtering method according to one technique. For example, a sputtering device for implementing the sputtering method is provided with a plurality of targets. As shown in FIG. 1, there is a gap between adjacent targets of the plurality of targets, so that the thickness of the formed film fluctuates. Inventors discover that, a concave portion of the formed film has a higher oxygen content so that the carrier mobility is lower, and a convex portion of the formed film has a lower oxygen content so that the carrier mobility is higher, resulting in an uneven carrier mobility of the formed film, which further leads to a Mura phenomenon in the case that the formed film serves as an active layer.

According to the embodiments of the present disclosure, there is provided a thin film transistor. The thin film transistor comprises an active layer, a target oxide is formed at a portion of the active layer where an oxygen content is higher than oxygen contents of other portions of the active layer, and a carrier mobility of the target oxide is greater than that of other portions of the active layer.

Figure 2:
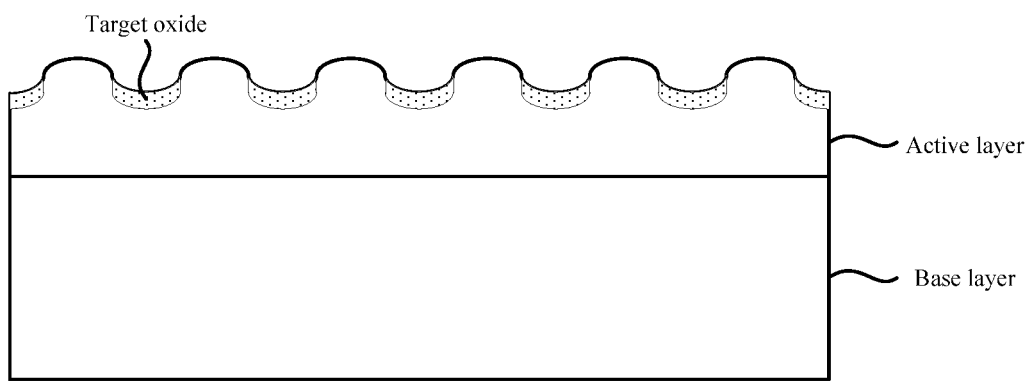
FIG. 2 shows a structural schematic view of an active layer of a thin film transistor according to embodiments of the present disclosure.
Figure 3:
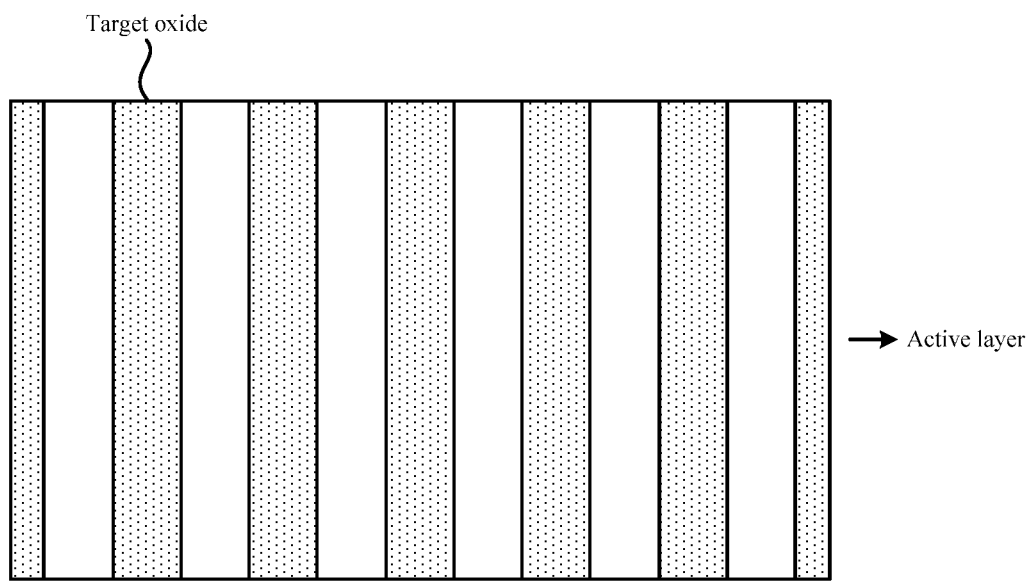
FIG. 3 is a plan view of the active layer of the thin film transistor shown in FIG. 2.

For example, as shown in FIG. 2, the active layer is formed on a base layer. It should be noted that, the base layer may be provided with other components of the thin film transistor.

At the portion of the active layer where the oxygen content is higher than oxygen contents of other portions of the active layer, the carrier mobility is lower than that of other portions of the active layer. By forming the target oxide whose carrier mobility is greater than that of other portions of the active layer at the portion where the oxygen content is higher than oxygen contents of other portions of the active layer, the carrier mobility at the portion where the oxygen content is higher than oxygen contents of other portions of the active layer can be effectively improved, so that the carrier mobility of the active layer becomes even, so as to reduce generation of Mura defects.

For example, the active layer is formed of an indium gallium zinc oxide, i.e., IGZO.

For example, the target oxide is a zinc-based oxynitride formed by performing a plasma treatment on the active layer with using $N_2$. The zinc-based oxynitride (i.e., ZnON) has a carrier mobility higher than IGZO for forming the active layer and ZnO impurity in the active layer, so that the carrier mobility at the portion of the active layer where the oxygen content is higher than oxygen contents of other portions of the active layer is increased, and the carrier mobility of the active layer becomes even.

In addition, in the case that a light irradiates on the active layer, an oxygen vacancy in the active layer may be excited by the light. For example, a light with a wavelength of less than 539 nm excites the oxygen vacancy in the active layer. A band gap of the zinc-based oxynitride is 1.3 eV, so that the zinc-based oxynitride absorbs a light with a wavelength of less than 1240/1.3=953 nm Accordingly, the zinc-based oxynitride absorbs the light that excites the oxygen vacancy in the active layer, and the stability of the active layer is improved.

For example, the active layer is formed by using a plurality of targets of a sputtering device, the portion of the active layer between adjacent targets of the plurality of targets has a higher oxygen content so that the carrier mobility is lower; and thus, the plasma treatment is performed with using $N_2$ on the portion of the active layer between the adjacent targets of the plurality of targets, so as to form the zinc-based oxynitride.

In the case that the active layer is formed by using a plurality of targets, the active layer has a good flatness macroscopically. However, microscopically, the portion of the active layer between the adjacent targets is thinner so that a concave portion appears; and the active layer at this concave portion has a higher oxygen content, so the carrier mobility at the concave portion is lower. Thus, the plasma treatment is performed with using $N_2$ on the concave portion of the active layer to form the target oxide, so as to ensure that the carrier mobility of the active layer becomes even.

For example, a modified layer is formed at a portion of the active layer where an oxygen content is lower than oxygen contents of other portions of the active layer, and the carrier mobility of the modified layer is lower than that of other portions of the active layer.

Figure 4:
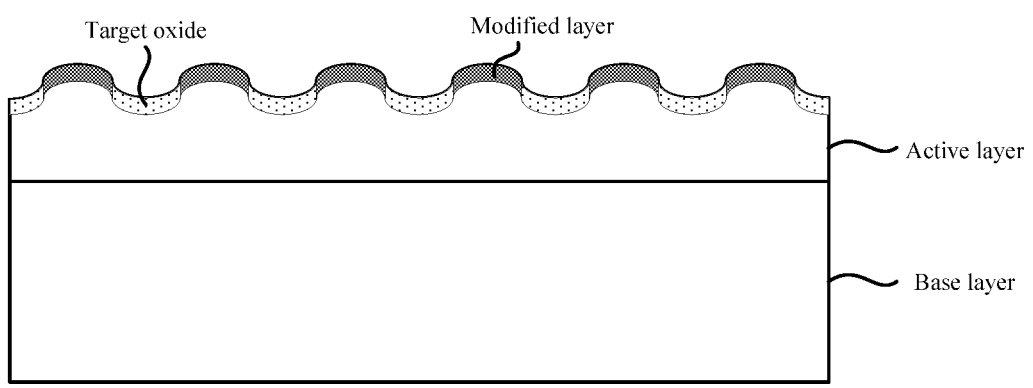
FIG. 4 shows another structural schematic view of the active layer of the thin film transistor according to the embodiments of the present disclosure.
Figure 5:
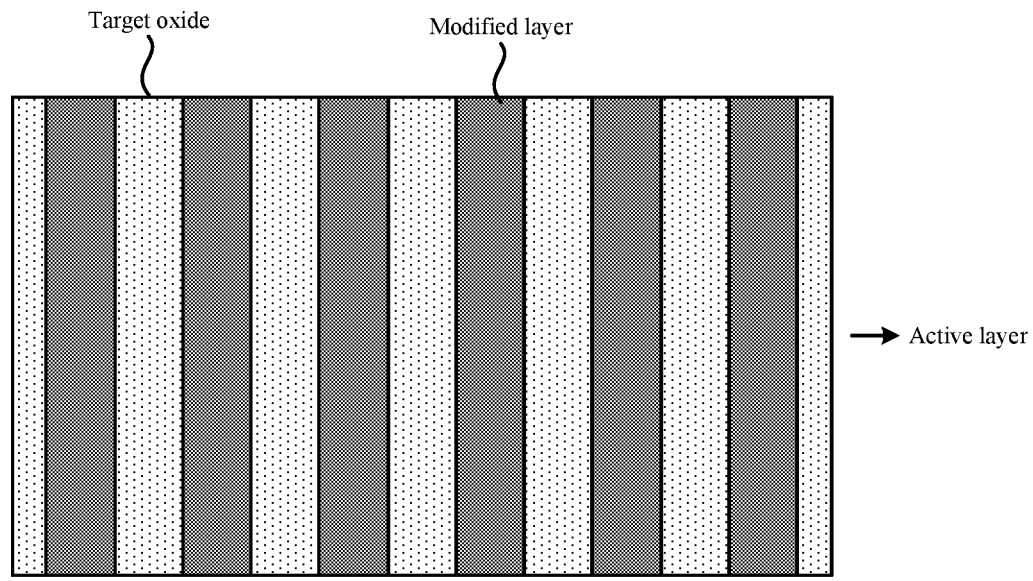
FIG. 5 is a plan view of the active layer of the thin film transistor shown in FIG. 4.

As shown in FIG. 4 and FIG. 5, for example, a portion of the active layer corresponding to each target of the plurality of targets are subjected to a plasma treatment with using $N_2O$ and/or $O_2$ to form the modified layer, the oxygen content of the modified layer is higher than that of the active layer, and thus the carrier mobility of the modified layer is lower than that of the active layer.

The portion of the active layer corresponding to each target is thicker so that a convex portion appears; the convex portion of the active layer has a lower oxygen content so that the carrier mobility of the convex portion is higher, the plasma treatment is performed with using $N_2O$ and/or $O_2$ on the convex portion of the active layer to form the modified layer, which increases the oxygen content of the convex portion of the active layer and reduces the carrier mobility of the convex portion of the active layer. In this way, the carrier mobility of the convex portion of the active layer and the carrier mobility of the concave portion of the active layer tend to be consistent, so that the carrier mobility of the active layer becomes even to reduce generation of Mura defects.

For example, in a same plasma treatment process, the plasma treatment is performed with using $N_2$ on the portion of the active layer between adjacent targets of the plurality of targets and the plasma treatment is performed with using $N_2O$ and/or $O_2$ on the portion of the active layer corresponding to each target of the plurality of targets. The plasma treatments performed on the two portions are completed in the same process, which reduces fabrication steps and simplifies the fabrication process.

It should be noted that, the thin film transistor according to the embodiments of the present disclosure further comprises a gate electrode, a gate insulating layer, a source electrode, a drain electrode and other components, and the details thereof will not be repeated here.

The embodiments of the present disclosure further provide a display device, and the display device comprises the thin film transistor as described above.

It should be noted that, the display device according to the embodiments of the present disclosure may be an E-paper, a mobile phone, a tablet personal computer, a television, a laptop computer, a digital photo frame, a navigator, or any other product or component having a display function.

Figure 6:
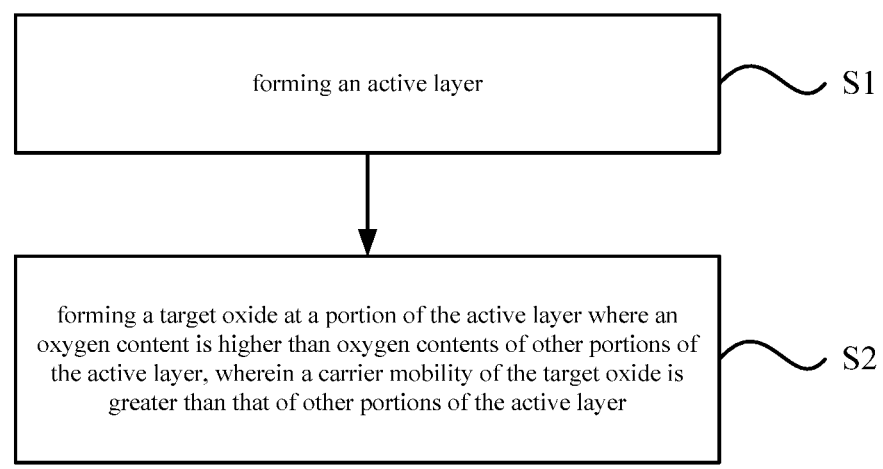
FIG. 6 shows a flow chart of a fabrication method of a thin film transistor according to the embodiments of the present disclosure.

As shown in FIG. 6, a fabrication method of a thin film transistor according to the embodiments of the present disclosure comprises the following steps.

S1: forming an active layer;

S2: forming a target oxide at a portion of the active layer where an oxygen content is higher than oxygen contents of other portions of the active layer, wherein a carrier mobility of the target oxide is greater than that of other portions of the active layer.

For example, a plasma treatment is performed on the active layer to form the target oxide.

For example, the active layer is made of an indium gallium zinc oxide. For example, the performing the plasma treatment on the active layer includes: performing the plasma treatment with using $N_2$ on the active layer to form a zinc-based oxynitride.

For example, the forming the active layer includes: forming the active layer by using a plurality of targets of a sputtering method. For example, the performing the plasma treatment on the active layer includes: performing the plasma treatment with using $N_2$ on a portion of the active layer between adjacent targets of the plurality of targets.

For example, the performing the plasma treatment on the active layer further includes: performing the plasma treatment with using $N_2O$ and/or $O_2$ on a portion of the active layer corresponding to each target of the plurality of targets.

For example, in a same plasma treatment process, the plasma treatment is performed with using $N_2$ on the portion of the active layer between adjacent targets of the plurality of targets and the plasma treatment is performed with using $N_2O$ and/or $O_2$ on the portion of the active layer corresponding to each target of the plurality of targets.

According to the embodiment of the present disclosure, the target oxide (e.g., the zinc-based oxynitride) is formed at the portion of the active layer where the oxygen content is higher than oxygen contents of other portions of the active layer, the target oxide has the carrier mobility higher than that of the active layer itself. In this way, the carrier mobility of the portion of the active layer where the oxygen content is higher than oxygen contents of other portions of the active layer is increased, so that the overall carrier mobility of the active layer becomes even, to reduce the Mura defects caused by uneven carrier mobility of the active layer.

It should be noted that, in the drawings, sizes of layer and region may be exaggerated in order to make the diagrams clear. It can be understood that, in the case that an element or a layer is called to be located "on" the other element or layer, it may be directly located on the other element, or there may be an intermediate layer. In addition, it can be understood that, in the case that an element or a layer is called to be located "below" the other element or layer, it may be directly located below the other element, or there may be an intermediate layers or elements. In addition, it can be understood that, in the case that a layer or an element is called to be located "between" two elements or layers, it may be a unique layer between the two elements or layers, or there may be more than one intermediate layers or elements. Similar reference signs indicate similar elements throughout the present disclosure.

In the present disclosure, the term "a plurality of" refers to two or more, unless defined expressly otherwise.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510182175.3 filed on Apr. 16, 2015, the disclosure of which is incorporated herein by reference in its entirety as part of the present application.

The invention claimed is:

1. A thin film transistor, comprising an active layer, wherein
a target oxide is formed at a portion of the active layer where an oxygen content is higher than oxygen contents of other portions of the active layer, and a carrier mobility of the target oxide is greater than that of other portions of the active layer.

2. The thin film transistor according to claim 1, wherein the active layer is made of an indium gallium zinc oxide.

3. The thin film transistor according to claim 2, wherein the target oxide is formed of a zinc-based oxynitride.

4. The thin film transistor according to claim 1, wherein the active layer is formed by using a sputtering device having a plurality of targets, and the target oxide is formed at a portion of the active layer between adjacent targets of the plurality of targets.

5. The thin film transistor according to claim 4, wherein a modified layer is formed at a portion of the active layer corresponding to each target of the plurality of targets, and a carrier mobility of the modified layer is lower than that of other portions of the active layer.

6. The thin film transistor according to claim 5, wherein, in a same plasma treatment process, the target oxide and the modified layer are formed.

7. The thin film transistor according to claim 1, wherein, a modified layer is formed at a portion of the active layer where an oxygen content is lower than oxygen contents of other portions of the active layer, and the carrier mobility of the modified layer is lower than that of other portions of the active layer.

8. A display device, comprising the thin film transistor according to claim 1.

* * * * *